US011888485B2

(12) United States Patent
Tsuda et al.

(10) Patent No.: US 11,888,485 B2
(45) Date of Patent: Jan. 30, 2024

(54) PULSE POWER SUPPLY DEVICE

(71) Applicant: Mitsubishi Electric Corporation, Tokyo (JP)

(72) Inventors: Shingo Tsuda, Tokyo (JP); Taichiro Tamida, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 17/925,015

(22) PCT Filed: Jun. 17, 2020

(86) PCT No.: PCT/JP2020/023842
§ 371 (c)(1),
(2) Date: Nov. 14, 2022

(87) PCT Pub. No.: WO2021/255875
PCT Pub. Date: Dec. 23, 2021

(65) Prior Publication Data
US 2023/0188123 A1    Jun. 15, 2023

(51) Int. Cl.
*H03K 3/57*    (2006.01)

(52) U.S. Cl.
CPC ...................... *H03K 3/57* (2013.01)

(58) Field of Classification Search
None
See application file for complete search history.

(56) References Cited

U.S. PATENT DOCUMENTS 3,116,421 A * 12/1963 Newhall ................ H03K 17/82
307/422
3,117,235 A * 1/1964 Young ..................... H03K 3/45
307/419

(Continued)

FOREIGN PATENT DOCUMENTS

| JP | 9-83052 A | 3/1997 |
| JP | 2001-238470 A | 8/2001 |
| WO | 2016/152738 A1 | 9/2016 |

OTHER PUBLICATIONS

International Search Report and Written Opinion dated Aug. 25, 2020, received for PCT Application PCT/JP2020/023842, filed on Jun. 17, 2020, 8 pages including English Translation.

*Primary Examiner* — Thomas J. Hiltunen
*Assistant Examiner* — Khareem E Almo
(74) *Attorney, Agent, or Firm* — XSENSUS LLP

(57) ABSTRACT

A pulse power supply device includes pulse power supplies each of which outputs a monopolar pulse voltage, and transformers. The transformers include primary windings, secondary windings, and tertiary windings, and one pulse power supply is connected to one primary winding on a one-to-one basis. The secondary windings are sequentially connected in series, and a load is connected to both ends of the secondary windings. The tertiary windings are sequentially connected in series, and a magnetic reset circuit is connected to both ends of the tertiary windings. The magnetic reset circuit includes a magnetic reset power supply and an impedance changing circuit that is for limiting an induced current that can be caused to flow by a voltage induced in the tertiary windings. An impedance changing circuit is configured to be able to change an impedance.

8 Claims, 11 Drawing Sheets

(56) References Cited

U.S. PATENT DOCUMENTS

| | | | | |
|---|---|---|---|---|
| 3,406,352 | A * | 10/1968 | Gardenghi | H03F 3/245 |
| | | | | 330/306 |
| 3,502,898 | A * | 3/1970 | Paivinen | H03K 19/16 |
| | | | | 307/411 |
| 3,631,333 | A * | 12/1971 | Pichal | H03H 7/25 |
| | | | | 333/81 R |
| 5,905,646 | A * | 5/1999 | Crewson | H03K 3/57 |
| | | | | 363/16 |
| 6,359,424 | B2 * | 3/2002 | Lida | H03K 3/57 |
| | | | | 323/251 |
| 6,442,052 | B1 * | 8/2002 | Hemena | H02M 3/33569 |
| | | | | 363/56.12 |
| 11,070,137 | B1 * | 7/2021 | Carden | G01R 19/175 |
| 2004/0145928 | A1 * | 7/2004 | Takada | H02M 3/158 |
| | | | | 363/95 |
| 2017/0338618 | A1 * | 11/2017 | Jiang | H01S 3/225 |
| 2022/0103079 | A1 * | 3/2022 | Hariya | G01R 19/0092 |
| 2022/0278608 | A1 * | 9/2022 | Carden | H02M 1/40 |

* cited by examiner

FIG.10

OPERATION CONDITION (A)

| PULSE VOLTAGE [V] | PULSE WIDTH [ns] | NUMBER OF TRANSFORMERS [PIECES] | COMMAND VOLTAGE [kV] |
|---|---|---|---|
| 100 | 100 | 1 | 0.1 |
| 200 | 100 | 1 | 0.2 |
| 300 | 100 | 1 | 0.3 |
| 400 | 100 | 1 | 0.4 |
| 500 | 100 | 1 | 0.5 |
| 600 | 100 | 1 | 0.6 |
| 700 | 100 | 1 | 0.7 |
| 100 | 100 | 2 | 0.2 |
| 200 | 100 | 2 | 0.4 |
| 300 | 100 | 2 | 0.6 |
| 400 | 100 | 2 | 0.8 |
| 500 | 100 | 2 | 1 |
| 600 | 100 | 2 | 1.2 |
| 700 | 100 | 2 | 1.4 |
| 500 | 140 | 7 | 3.5 |
| 700 | 300 | 15 | 10.5 |

PULSE POWER SUPPLY DEVICE

CROSS-REFERENCE TO RELATED APPLICATION

The present application is based on PCT filing PCT/JP2020/023842, filed Jun. 17, 2020, the entire contents of which are incorporated herein by reference.

FIELD

The present disclosure relates to a pulse power supply device that generates a monopolar high-voltage pulse by superimposing voltages through an operation of a plurality of switching elements.

BACKGROUND

A pulse power supply device that generates a high-voltage pulse is used for a sterilization device using pulse arc discharge, a water treatment device, a laser oscillator, an exhaust as purification device, an ozone generator, an extreme ultra-violet. (EUV) light source, and the like. These devices require momentarily very high pulse power. For this reason, the pulse power supply device used for these devices is required to release pulse power, which is electrical energy, released in pulses, in an extremely short time.

Conventionally, a gas discharge switch has been used in this type of pulse power supply device. However, the gas discharge switch has a problem such as a short duration of discharge and low stability. In recent years, a semiconductor switching element has been used, thus a monopolar high-voltage pulse having a short pulse width can be generated by a transformer superimposing an induced voltage generated by the semiconductor switching element.

When a monopolar high-voltage pulse is repeatedly outputted, residual magnetism generated due to magnetic saturation remains in a magnetic body of the transformer that superimposes an induced voltage. In a case where this residual magnetism is large, there is a problem in that a change in magnetic flux in the transformer becomes small, an amount of superposition of the induced voltage becomes small, and generation of a high-voltage pulse becomes difficult.

Under such a technical background, Patent Literature 1 below discloses a configuration in which, in order to reduce magnetic saturation of the saturable reactor, there is included a magnetic reset circuit that supplies a reset current to a reset winding of a saturable reactor to reversely excite an iron core of the saturable reactor.

CITATION LIST

Patent Literature

Patent Literature 1: Japanese Patent Application Laid-open No. H9-83052

SUMMARY

Technical Problem

The magnetic reset circuit requires a power supply for causing a reset current to flow, and a restraint coil for restraining an excessive current caused by an induced voltage. In order to prevent the excessive current caused by the induced voltage from flowing to the power supply, it is necessary to increase an inductance value of the restraint coil. However, when the inductance value of the restraint coil is large, there is a problem in that an output impedance of a power supply unit in the pulse power supply device is affected, and it becomes difficult to obtain an output voltage having a desired pulse width.

The present disclosure has been made in view of the above, and an object thereof is to obtain a pulse power supply device capable of obtaining an output voltage having a desired pulse width by reducing or preventing an influence of an output impedance of a power supply unit.

Solution to Problem

In order to solve the above-described problem and achieve the object, a pulse power supply device according to the present disclosure includes a plurality of pulse power supplies each of which outputs a monopolar pulse voltage, and a plurality of transformers. Each of the plurality of transformers includes a primary winding, a secondary winding, and a tertiary winding, and one pulse power supply is connected to one primary winding on a one-to-one basis. A plurality of the secondary windings are sequentially connected in series, and both ends of a plurality of the secondary windings connected in series constitute output terminals. A load is connected to the output terminals to form a first closed circuit. A plurality of the tertiary windings are sequentially connected in series, and both ends of a plurality of the tertiary windings connected in series constitute voltage application terminals. A magnetic reset circuit is connected to the voltage application terminals, and a plurality of the tertiary windings and the magnetic reset circuit form a second closed circuit. The magnetic reset circuit includes a magnetic reset power supply that is a power supply for causing a reset current to flow through the tertiary windings, and includes an impedance changing circuit. The impedance changing circuit is configured to be able to change an impedance for limiting an induced current that can be caused to flow in the second closed circuit by a voltage induced in the tertiary windings.

Advantageous Effects of Invention

According to the pulse power supply device according to the present disclosure, there is an effect of being able to obtain an output voltage having a desired pulse width by reducing or preventing an influence of an output impedance of the power supply unit.

BRIEF DESCRIPTION OF DRAWINGS

FIG. 10 is a table illustrating an example of operation conditions when the pulse power supply device according to the first embodiment is operated.

DESCRIPTION OF EMBODIMENTS

Hereinafter, a pulse power supply device according to embodiments of the present disclosure will be described in detail with reference to the accompanying drawings.

First Embodiment

Figure 1:
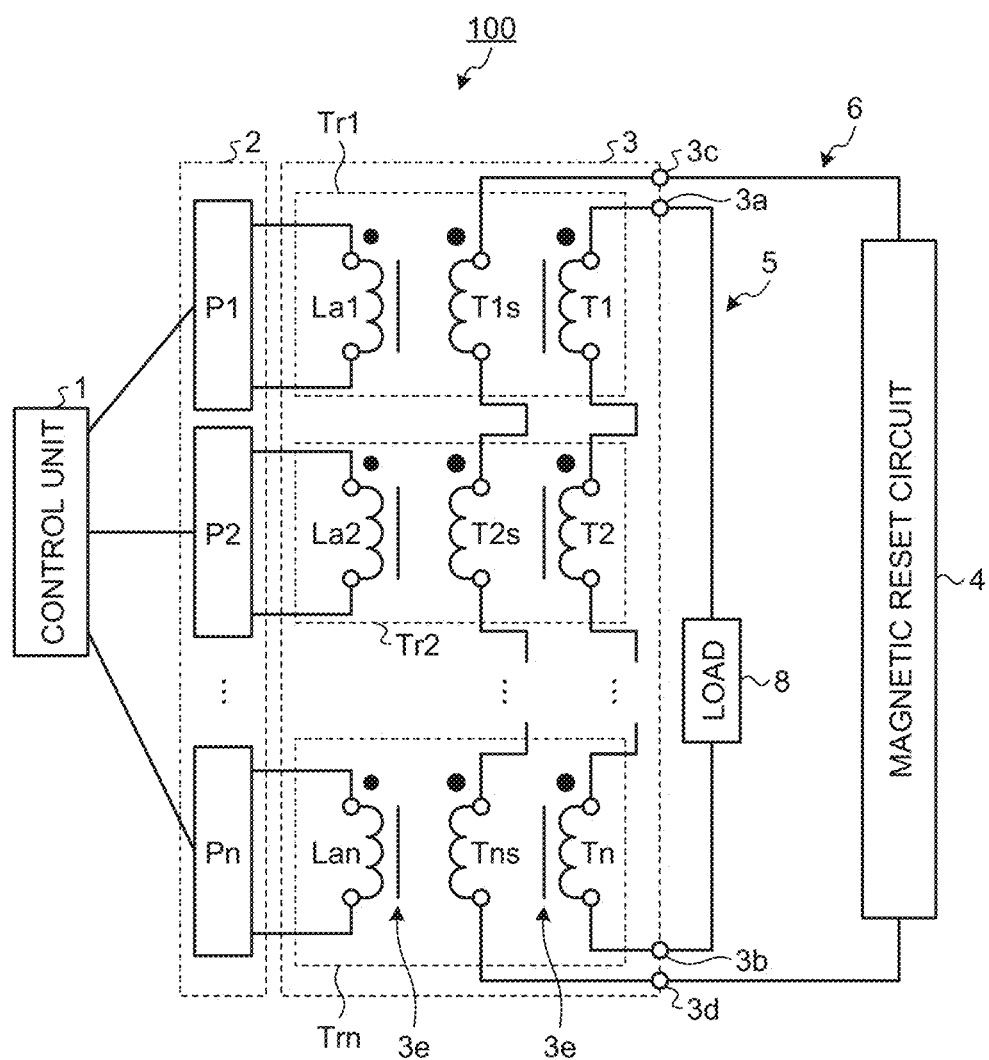
FIG. 1 is a diagram illustrating a configuration example of a pulse power supply device according to a first embodiment.

FIG. 1 is a diagram illustrating a configuration example of a pulse power supply device according to a first embodiment. As illustrated in FIG. 1, a pulse power supply device 100 according to the first embodiment includes a control unit 1, a power supply unit 2, a transformer group 3, and a magnetic reset circuit 4. The power supply unit 2 includes a plurality of pulse power supplies P1, P2, . . . , and Pn each of which outputs a monopolar pulse voltage. Reference character "n" represents an integer of 2 or more. The transformer group 3 includes transformers Tr1, Tr2, . . . , Trn, the number of which is n, that is, the number of which is equal to the number of the pulse power supplies P1 to Pn. The plurality of transformers Tr1 to Trn include primary windings La1, La2, . . . , and Lan, secondary windings T1, T2, . . . , and Tn, tertiary windings T1s, T2s, . . . , and Tns, respectively, and each includes a magnetic body core 3e. The primary windings La1 to Lan, the secondary windings T1 to Tn, and the tertiary windings T1s to Tns, respectively, are magnetically coupled to one another via the magnetic body core 3e.

The pulse power supply P1 is connected to the primary winding La1, the pulse power supply P2 is connected to the primary winding La2, and the pulse power supply Pn is connected to the primary winding Lan. That is, one pulse power supply is connected to one primary winding on a one-to-one basis.

The secondary windings T1 to Tn are sequentially connected in series, and both ends of the secondary windings T1 and Tn connected in series constitute output terminals 3a and 3b. A load 8 is connected to the output terminals 3a and 3b, and the secondary windings T1 to Tn and the load 8 form a first closed circuit 5. Examples of the load 8 include the sterilization device, the water treatment device, the laser oscillator, the exhaust gas purification device, the ozone generator, and the EUV light source described above.

The tertiary windings T1s to Tns are sequentially connected in series, and both ends of the tertiary windings T1s and Tns connected in series constitute voltage application terminals 3c and 3d. The magnetic reset circuit 4 is connected to the voltage application terminals 3c and 3d, and the tertiary windings T1s to Tns and the magnetic reset circuit 4 form a second closed circuit 6.

Figure 2:
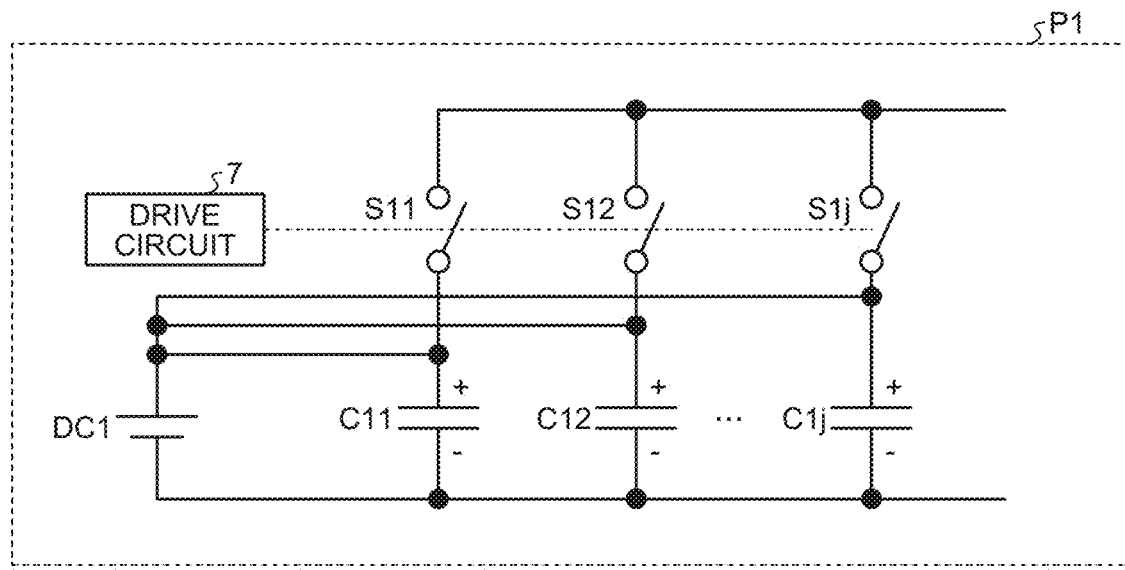
FIG. 2 is a diagram illustrating a configuration example of a pulse power supply in the first embodiment.

FIG. 2 is a diagram illustrating a configuration example of a pulse power supply according to the first embodiment. FIG. 2 representatively illustrates a configuration of the pulse power supply P1 among the pulse power supplies P1 to Pn illustrated in FIG. 1.

The pulse power supply P1 includes a plurality of switching elements S11, S12, . . . , and S1j, a plurality of capacitors C11, C12, . . . , and C1j, a DC power supply DC1, and a drive circuit 7. Reference character "j" represents an integer of 2 or more. The plurality of capacitors C11 to C1j are connected in parallel to one another, and each is connected in series to each of the switching elements S11 to S1j. The drive circuit 7 drives the switching elements S11, S12, . . . , and S1j to be turned on or off. An operation of the drive circuit 7 is controlled by the control unit 1. The DC power supply DC1 applies a DC voltage to both ends of each of the capacitors C11 to C1j to charge each of the capacitors C11 to C1j. Note that, in FIG. 2, the DC power supply DC1 and each of the capacitors C11 to C1j are illustrated to be always connected. However, the DC power supply DC1 and each of the capacitors C11 to C1j are connected each time of changing, and are electrically disconnected other than charging periods. However, in a case where each of the capacitors C11 to C1j individually includes a DC power supply, each of the capacitors C11 to C1j may be always connected to the corresponding DC power supply.

As described above, the pulse power supply P1 includes a plurality of series circuits in which one switching element and one capacitor are connected in series, and the plurality of series circuits are connected in parallel to one another to form a series-parallel circuit. With this configuration, by turning on at least one of the switching elements S11 to S1j, electric charges of the capacitor connected to the switching element controlled to be turned on are released. As a result, a monopolar pulse voltage is outputted from both ends of the series-parallel circuit and applied to the primary winding La1 of the transformer Tr1. Note that, the pulse power supplies P2 to Pn are configured similarly to the pulse power supply P1. Since the contents overlap, a detailed description thereof is omitted.

As the switching elements S11 to S1j, it is preferable that those having a high speed and a high withstand voltage are selected so as to obtain a pulse voltage having a desired pulse width. In addition, a voltage value of the DC power supply DC1 in the pulse power supplies P1 to Pn is selected such that a voltage exceeding a withstand voltage is not applied to the switching elements S11 to S1j.

In the pulse power supply device 100, pulse voltages outputted from the n numbers of pulse power supplies P1 to Pn are induced and superimposed in the n numbers of transformer Tr1 to Trn. As a result, a high-voltage pulse output is obtained on the secondary side of the transformers Tr1 to Trn. For example, when a charging voltage of the pulse power supplies P1 to Pn is 1 [kV], the voltage that is induced and superimposed is 1×n [kV]. Hereinafter, the voltage that is induced and superimposed is referred to as an "induced superimposed voltage".

Figure 3:
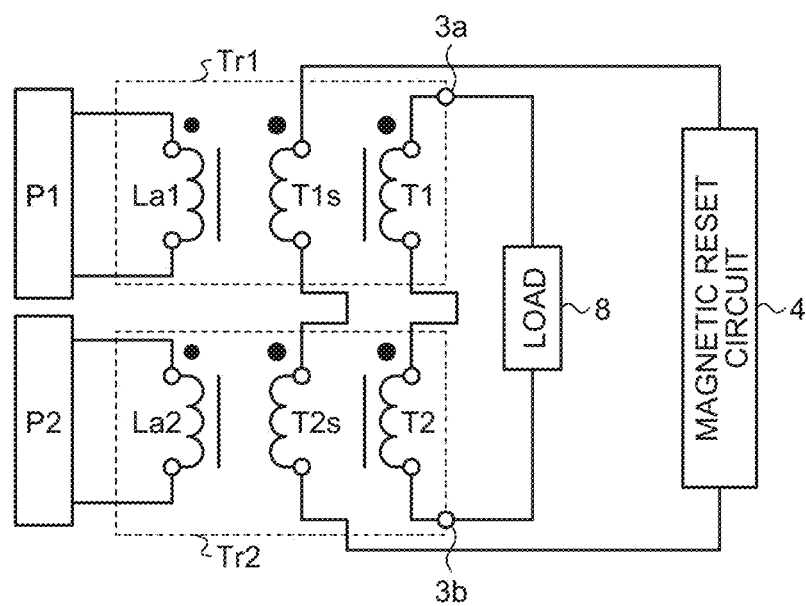
FIG. 3 is a diagram illustrating a configuration example to be used to describe an operation of the pulse power supply device according to the first embodiment.

FIG. 3 is a diagram illustrating a configuration example to be used to describe an operation of the pulse power supply device according to the first embodiment. FIG. 3 is an exemplar configuration in a case where the number of transformers in the configuration of FIG. 1 is two, and the two pulse power supplies P1 and P2 are illustrated in accordance with the number of transformers.

Figure 4:
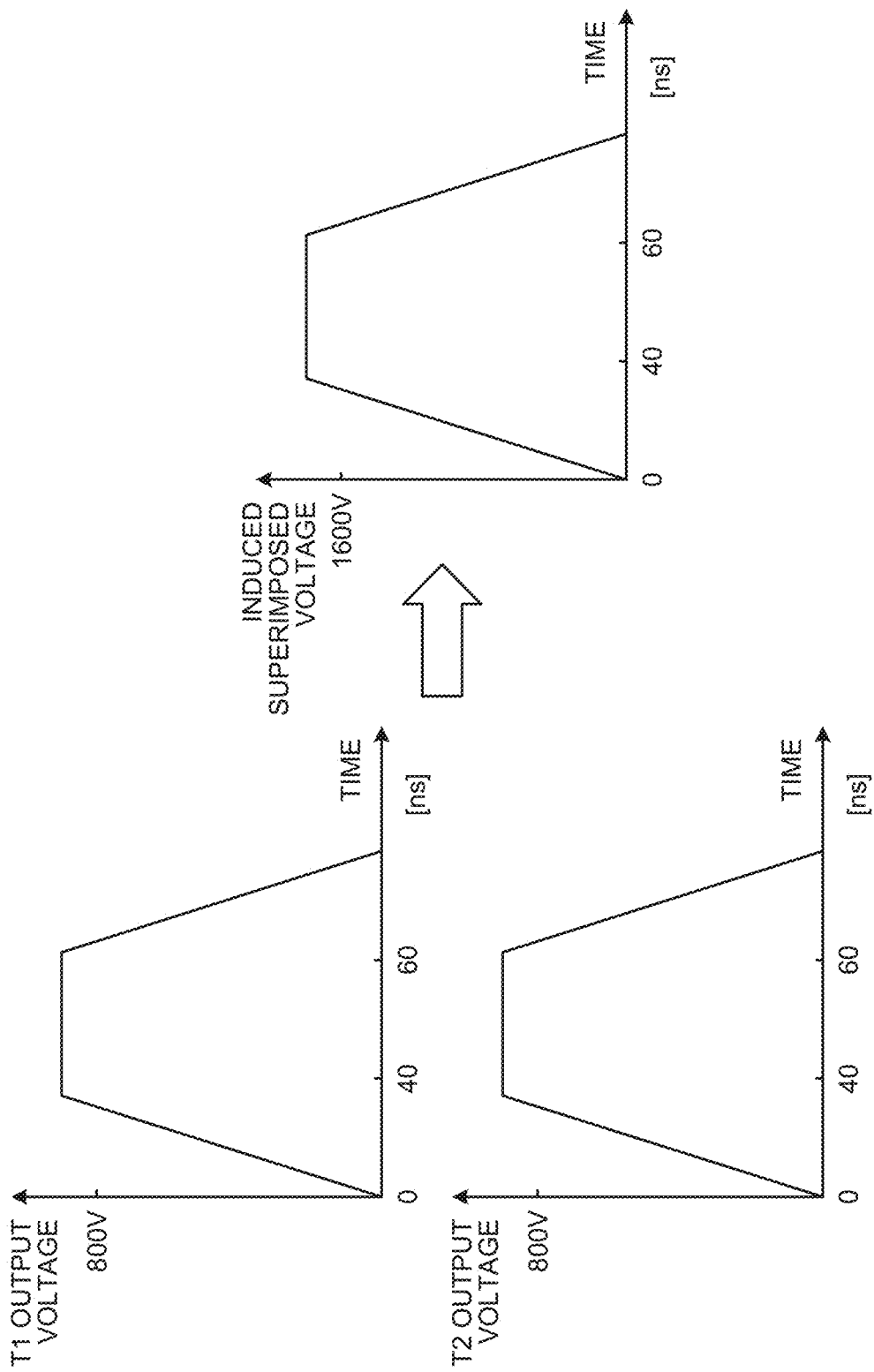
FIG. 4 is a graph illustrating a first example of an induced superimposed voltage generated in the pulse power supply device illustrated in FIG. 3.
Figure 5:
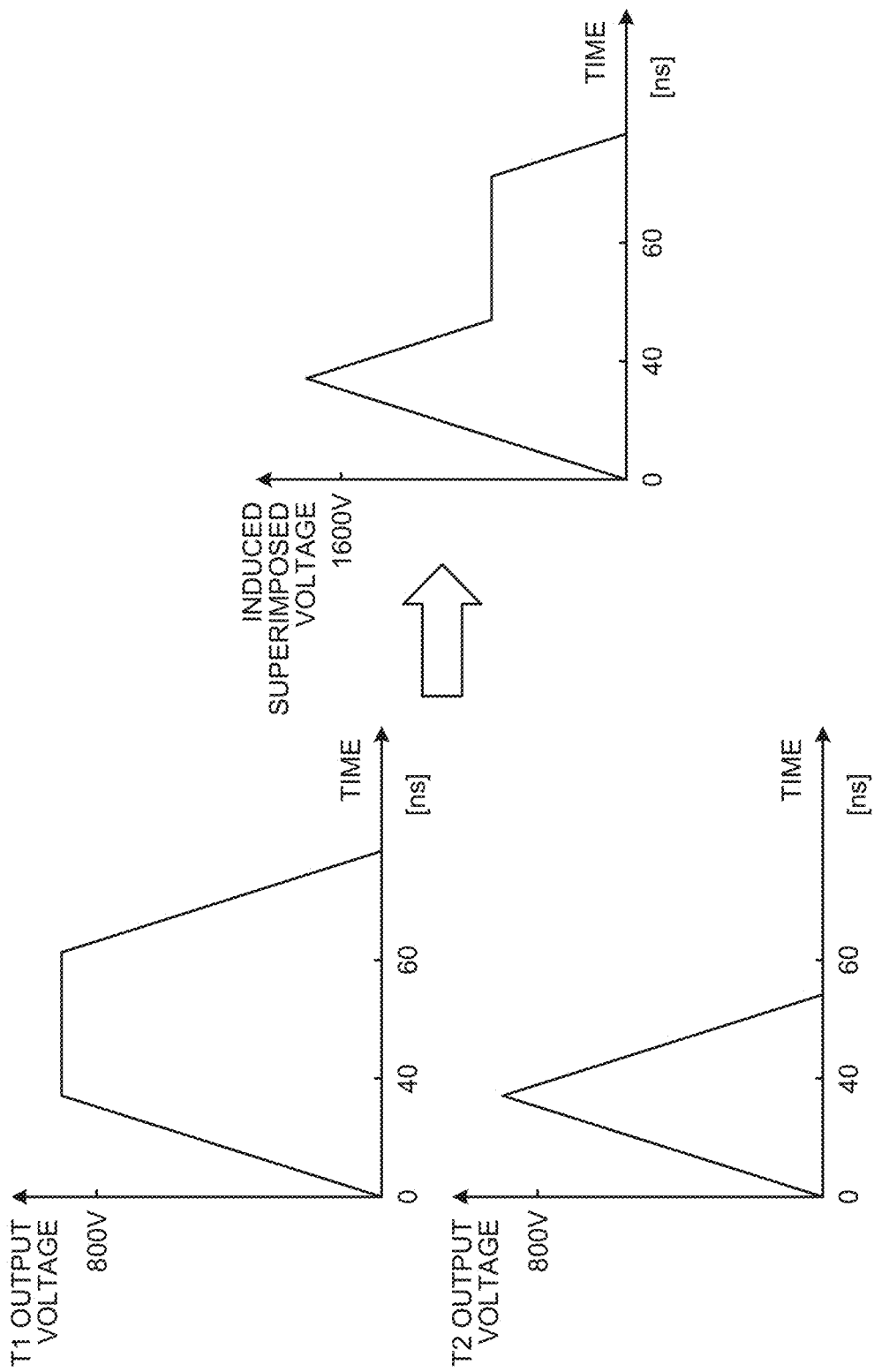
FIG. 5 is a graph illustrating a second example of an induced superimposed voltage generated in the pulse power supply device illustrated in FIG. 3.

FIG. 4 is a graph illustrating a first example of an induced superimposed voltage generated in the pulse power supply device illustrated in FIG. 3. FIG. 5 is a graph illustrating a second example of an induced superimposed voltage Generated in the pulse power supply device illustrated in FIG. 3. In FIGS. 4 and 5, a T1 output voltage outputted from the secondary winding T1 of the transformer Tr1 is illustrated in an upper part on a left side, and a T2 output voltage outputted from the secondary winding T2 of the transformer Tr2 is illustrated in a lower part on the left side. Further, on a right side of FIGS. 4 and 5, an induced superimposed voltage that is induced and superimposed by the secondary windings T1 and T2 is illustrated. A horizontal axis in each graph represents time.

As illustrated in FIG. 4, when amplitude values and pulse widths of pulse voltages outputted from the secondary windings T1 and T2 are equal, a double pulse voltage is obtained as an output voltage. Whereas, even if the amplitude values of the pulse voltages outputted from the secondary windings T1 and T2 are equal, when the pulse widths of the pulse voltages are different as illustrated in FIG. 5, a stepped pulse voltage is obtained as the output voltage. Note that, FIGS. 4 and 5 illustrate an example in which a waveform of the pulse voltage is changed by changing only the pulse width, but the number of transformers to be operated, a timing of the pulse voltage output, and the like may be changed. By doing in this way, various pulse voltage waveforms can be formed.

Figure 6:
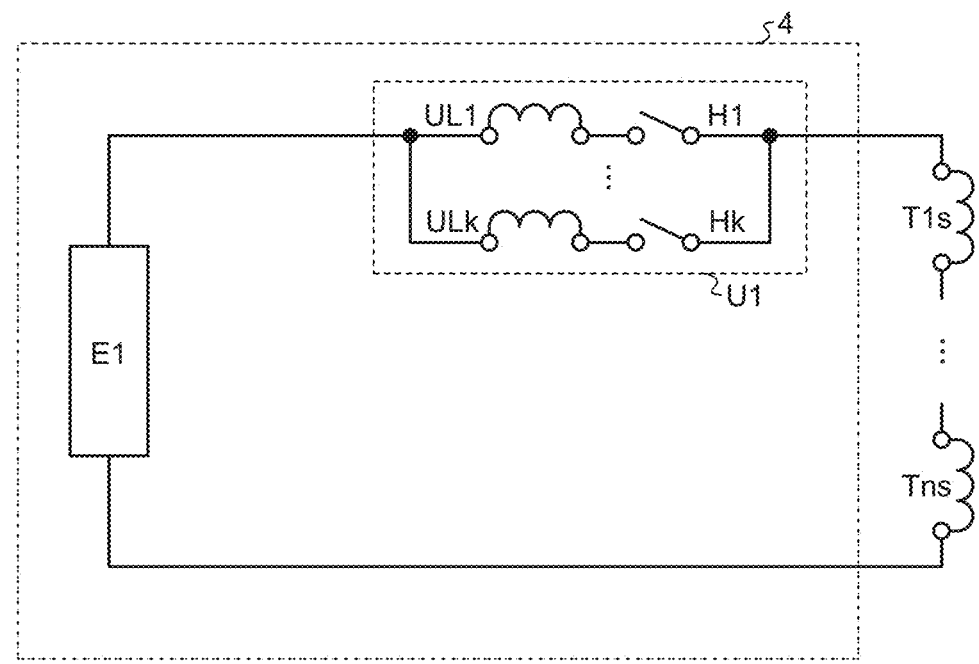
FIG. 6 is a diagram illustrating an exemplar configuration of a magnetic reset circuit according to the first embodiment.

FIG. 6 is a diagram illustrating an exemplar configuration of a magnetic reset circuit according to the first embodiment. The magnetic reset circuit 4 is a circuit unit to reduce or prevent magnetic saturation of the magnetic body cores 3e of the transformers Tr1 to Trn due to an output of a monopolar pulse. The magnetic reset circuit 4 includes a magnetic reset power supply E1. As described above, the second closed circuit 6 is configured by the tertiary windings T1s to Tns and the magnetic reset circuit 4. Therefore, magnetic reset of the magnetic body core 3e can be performed by causing a reverse excitation current to flow through the tertiary windings T1s to Tns of the transformers Tr1 to Trn by the magnetic reset power supply E1. By performing this control, magnetic saturation can be reduced by the time of the next operation, and the transformers Tr1 to Trn can be repeatedly operated. Note that the transformers Tr1 to Trn can be further downsized by increasing a voltage time product in the magnetic reset.

Note that, FIG. 6 illustrates a case where the magnetic reset power supply E1 is a DC power supply, it is not limited thereto. The magnetic reset power supply E1 may be a pulse power supply. In particular, in a case where it is desired to increase a number of times of magnetic reset per unit time, the magnetic reset power supply E1 is preferably a pulse power supply.

Further, the magnetic reset circuit 4 includes an impedance changing circuit U1. As illustrated in FIG. 6, the impedance changing circuit U1 is inserted in series between the magnetic reset power supply E1 and the tertiary windings T1s to Tns.

The impedance changing circuit U1 includes: a plurality of restraint coils UL1 to ULk connected in parallel to one another; and a plurality of switching elements H1 to Hk each of which connected in series to corresponding one of the restraint coils UL1 to ULk. Reference character "k" represents an integer of 2 or more. As a result, one switchable restraint coil is configured by a series circuit unit in which one restraint coil and one switching element are connected in series. In addition, k numbers of the switchable restraint coils are connected in parallel to one another in the configuration.

The restraint coils UL1 to ULk are circuit elements having inductance values. The restraint coils UL1 to ULk limit an induced current that can be caused to flow by an induced voltage that is induced in the tertiary windings T1s to Tns, to protect the magnetic reset power supply E1. In the magnetic reset circuit 4, as the restraint coils UL1 to ULk, appropriate ones are selected such that an excessive current caused by the induced voltages of the tertiary windings T1s to Tns does not flow to the magnetic reset power supply E1.

The restraint coils UL1 to ULk may all have equal inductance values, or may be configured by those having different inductance values. With the configuration implemented using different inductance values, the inductance value to be inserted into the second closed circuit 6 can be set to any value.

When the output voltage of the pulse power supply device 100 is large, it is necessary to increase the inductance value to be inserted into the second closed circuit 6, in order not to cause an excessive current to flow in the magnetic reset power supply E1. That is, the inductance value to be inserted into the second closed circuit 6 has a relationship of being directly proportional to magnitude of the output voltage. Whereas, when the inductance value inserted into the second closed circuit 6 is large, an output impedance of the pulse power supplies P1 to Pn magnetically coupled to the magnetic reset circuit 4 is affected. In this case, in the pulse power supply device 100, it is difficult to obtain an output voltage having a desired pulse width, particularly a short pulse width of 100 [ns] or less.

Figure 7:
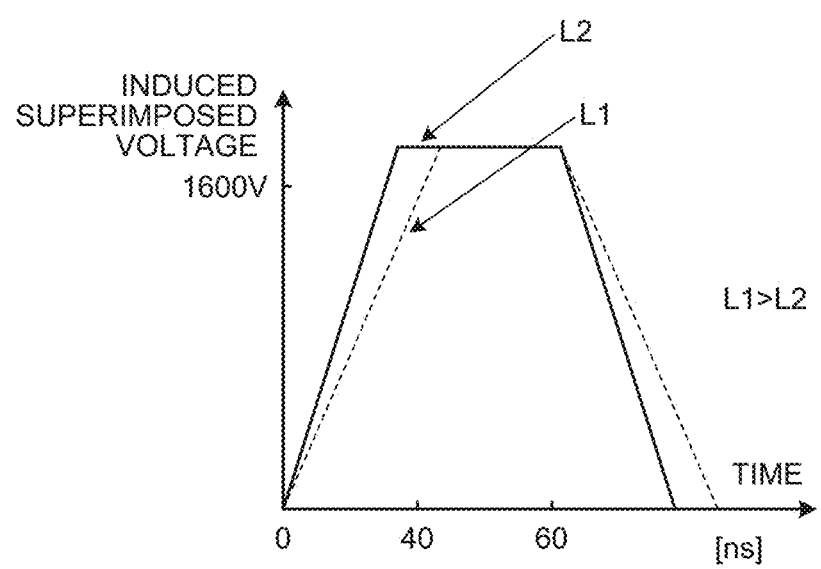
FIG. 7 is a graph to be used to describe an influence of an inductance value of an impedance changing circuit according to the first embodiment on an output impedance of a power supply unit in the pulse power supply device.

FIG. 7 is a graph to be used to describe an influence of an inductance value of the impedance changing circuit according to the first embodiment, on an output impedance of a power supply unit in the pulse power supply device.

In FIG. 7, a horizontal axis represents time, and a vertical axis represents an induced superimposed voltage. A broken line is an example of a waveform of an induced superimposed voltage in a case where the inductance value inserted into the second closed circuit 6 is L1. A solid line is an example of a waveform of an induced superimposed voltage in a case where the inductance value inserted into the second closed circuit 6 is L2. The inductance values L1 and L2 have a relationship of L1>L2.

As illustrated in FIG. 7, as the inductance value inserted into the second closed circuit 6 is larger, inclinations of a rise and a fall are smaller. Therefore, in order to reduce the influence of the output impedance, the pulse power supply device 100 according to the first embodiment is operated to switch the switching elements H1 to Hk in accordance with the output voltage, that is, the number of transformers to be driven. The switching of the switching elements H1 to Hk is performed by the control unit 1. The control unit 1 selects a combination of inductance values of the restraint coils UL1 to ULk within a range in which an excessive current does not flow in the magnetic reset power supply E1. As a result, an impedance of the pulse power supply device 100 as viewed from the power supply unit 2, that is, an output impedance of the pulse power supple device 100 can be prevented from becoming larger than necessary.

An inductance value of the impedance changing circuit U1 is made relatively large when the magnetic resetting is performed on the magnetic body cores 3e of the transformers Tr1 to Trn, and the inductance value of the impedance changing circuit U1 is made relatively small when the pulse voltage is outputted from the transformers Tr1 to Trn. As a result, it is possible to obtain an output voltage having a desired pulse width, while appropriately performing magnetic reset of the magnetic body core 3e. In addition, an output voltage having a shorter pulse width than that of a conventional pulse power supply device can be easily obtained. In addition, even if specifications of the transformers Tr1 to Trn, magnitude of the output voltage, or the like is changed, it is possible to flexibly cope with these.

Figure 8:
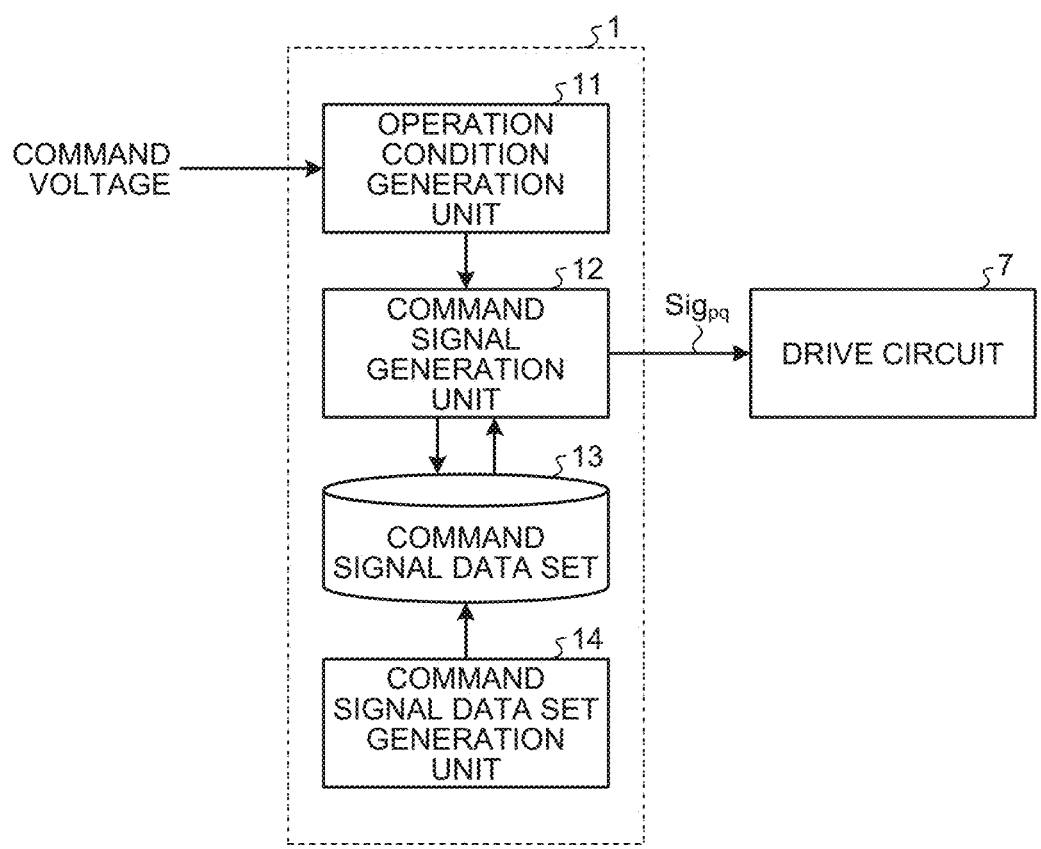
FIG. 8 is a diagram illustrating an exemplar configuration of a control unit according to the first embodiment.

Next, the control unit 1 will be described FIG. 8 is a diagram illustrating an exemplar configuration of a control unit according to the first embodiment. As illustrated in FIG. 8, the control unit 1 according to the first embodiment includes an operation condition generation unit 11, a command signal generation unit 12, a command signal data set 13, and a command signal data set generation unit 14. To the operation condition generation unit 11, a command voltage is inputted from outside. The command signal generation unit 12 generates a command signal $Sig_{pq}$, and outputs to each of the drive circuits 7 of the pulse power supplies P1 to Pn. Note that reference character "p" is any integer from 1 to n, and reference character "q" is any integer from 1 to j.

Figure 9:
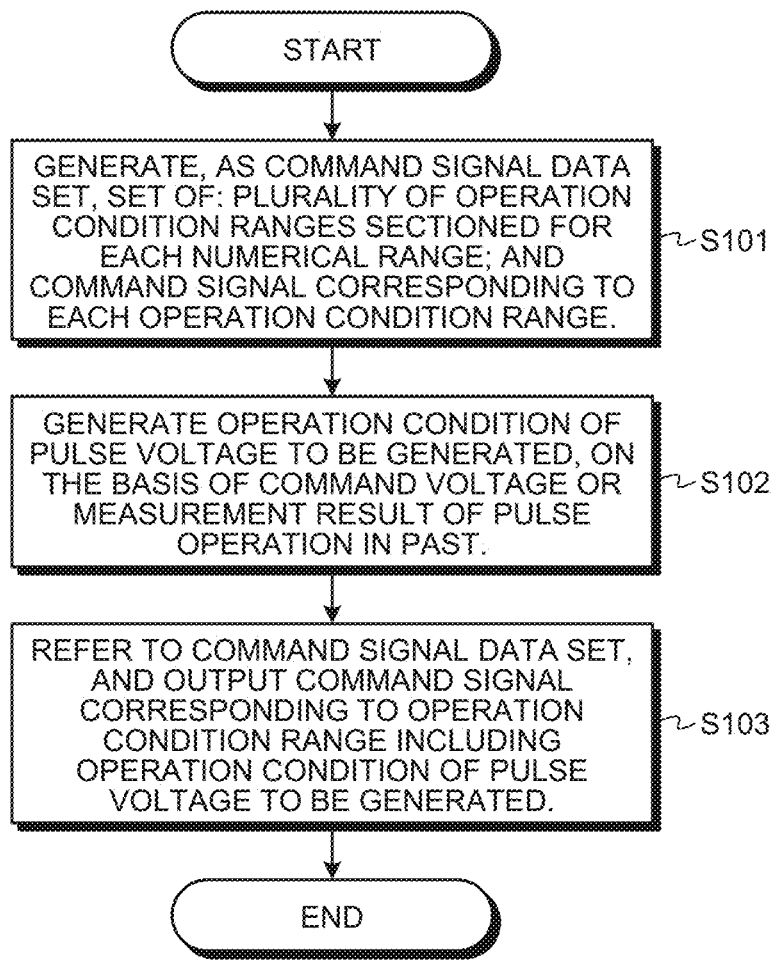
FIG. 9 is a flowchart to be used to describe an operation of the control unit according to the first embodiment.

The operation condition generation unit 11, the command signal generation unit 12, the command signal data set 13, and the command signal data set generation unit 14 operate with each other. The cooperative operation of these will be described with reference to FIGS. 9 and 10. FIG. 9 is a flowchart to be used to describe an operation of the control unit according to the first embodiment. FIG. 10 is a table illustrating an example of operation conditions when the pulse power supply device according to the first embodiment is operated.

FIG. 10 illustrates a set of a pulse voltage, a pulse width, and the number of transformers, as an operation condition (A) corresponding to a command voltage inputted to the control unit 1. The pulse voltage is an amplitude value of an output voltage outputted from the output terminals 3a and 3b. The pulse width is a pulse width of an output voltage outputted from the output terminals 3a and 3b. The number of transformers is the number of transformers Tr1 to Trn to be simultaneously operated when an output voltage is outputted.

The command signal data set generation unit 14 generates, as the command signal data set 13, a set of: a plurality of operation condition ranges sectioned for each numerical range; and the command signal $Sig_{pq}$ (p=1 to n, q=1 to j, the same applies hereinafter) corresponding to each operation condition range (step S101).

Describing more in detail, the command signal data set generation unit 14 determines the number of transformers necessary to achieve the operation condition (A) illustrated in FIG. 10. Then, the command signal $Sig_{pq}$ is determined for the operation condition (A). On the basis of the operation condition (A), the command signal data set generation unit 14 generates operation conditions of the switching elements S11 to Snj of the pulse power supplies P1 to Pn and operation conditions of the switching elements H1 to Hk to be operated when the restraint coils UL1 to ULk are selected. Note that, as for the operation conditions of the switching elements S11 to Snj, the command signal $Sig_{pq}$ can be determined on the basis of, as a determination standard, whether or not an operation based on the operation conditions is to be an operation in which a set of the pulse voltage, the pulse width, and the number of transformers is within a standard range. In addition, as for the operation conditions of the switching elements H1 to Hk, whether or not an operation based on the operation conditions is within a range of a current allowed for the magnetic reset power supply E1 can be set as a determination standard.

Note that, in FIG. 8, the command signal data set generation unit 14 is illustrated as a component of the control unit 1, but the configuration is not limited thereto. The command signal data set generation unit 14 may be a component external to the control unit 1. In addition, the control unit 1 may include an input unit instead of the command signal data set generation unit 14. The control unit 1 may be configured to input the command signal data set 13 created by a worker, via the input unit.

In addition, the command signal data set 13 may be provided inside the control unit 1 or may be provided outside. In addition, the command signal data set 13 may be generated on the basis of specifications of the switching elements S11 to Snj, specifications of the load 8, a test result, a calculation result, and the like.

Returning to the flowchart of FIG. 9, the operation condition generation unit 11 generates an operation condition of a pulse voltage to be generated, on the basis of a command voltage, a measurement result of a pulse operation in the past, or a combination thereof (step S102).

Next, the command signal generation unit 12 refers to the command signal data set 13 generated in step S101. Then, the command signal $Sig_{pq}$ that corresponds to an operation condition range including the operation condition of the pulse voltage generation generated in step S102, is outputted to the drive circuit 7 (step S103).

Note that the processing in step S101 and the processing in step S102 can be freely switched and performed. If the processing of step S101 is completed before the pulse power supply device 100 completes the operation of generating the pulse voltage, step S103 can be performed immediately after the operation condition is generated in step S102. As a result, time required for the processing can be shortened. In addition, in a case where the command signal data set generation unit 14 is provided outside the control unit 1, the processing of step S101 of FIG. 9 can be omitted, which makes it possible to reduce a burden required for calculation of the control unit 1.

In addition, in a case of a processing procedure in which step S101 is performed after step S102, it is possible to create the command signal data set 13 for the generated operation condition after the operation condition is generated. As a result, there is an advantage that the command signal data set 13 can be created for more various operation conditions. In addition, a storage device that stores the command signal data set 13 can be omitted.

In addition, a processing procedure in which both are combined may be used. For example, as for command signal data having a high use frequency, the command signal data is stored in the command signal data set 13 by performing the processing of step S101 before step S102. Then, as for command signal data having a low use frequency, it is acceptable that the processing of step S101 is performed again after the processing of step S102 is performed so that only necessary command signal data is generated.

Figure 11:
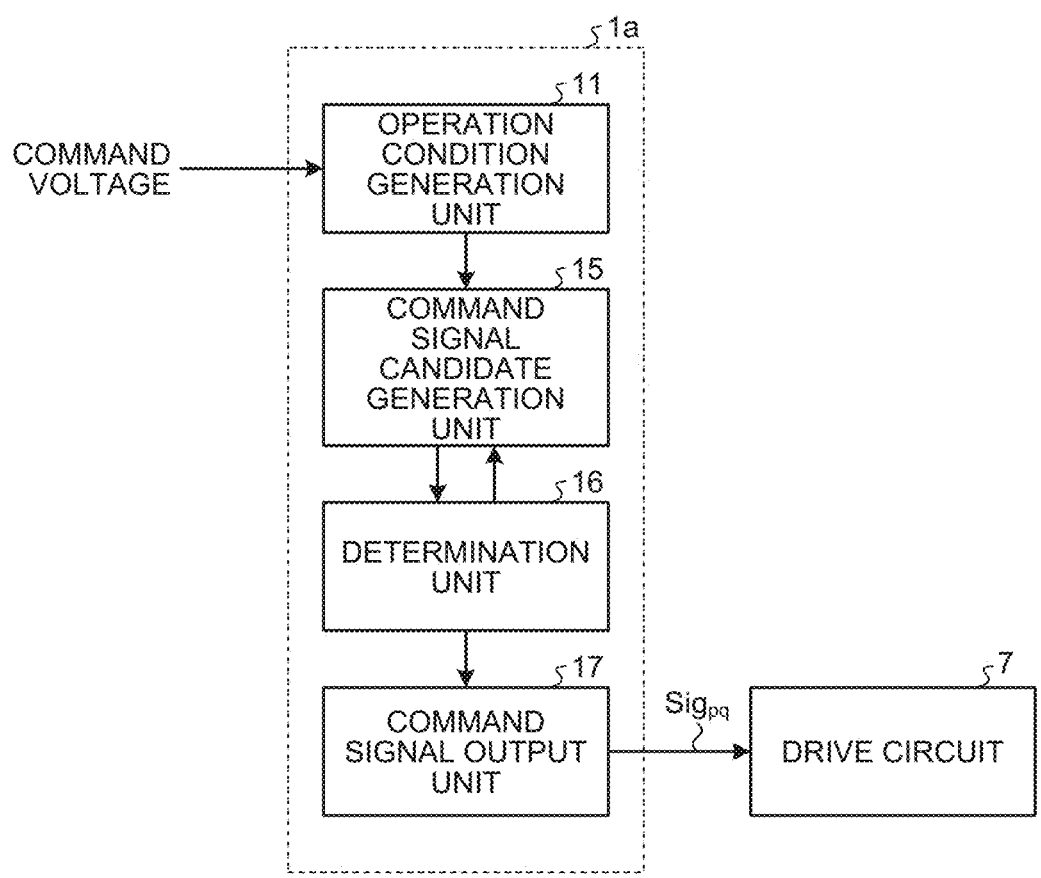
FIG. 11 is a diagram illustrating an exemplar configuration of a control unit according to a modification of the first embodiment.

Note that the control unit 1 may be configured as illustrated in FIG. 11. FIG. 11 is a diagram illustrating an exemplary configuration of a control unit according to a modification of the first embodiment. As illustrated in FIG. 11, a control unit 1a according to the modification of the first embodiment includes the operation condition generation unit 11, a command signal candidate generation unit 15, a determination unit 16, and a command signal output unit 17. To the operation condition generation unit 11, a command voltage is inputted from outside. The command signal output unit 17 generates the command signal $Sig_{pq}$, and output to each of the drive circuits 7 of the pulse power supplies P1 to Pn.

Figure 12:
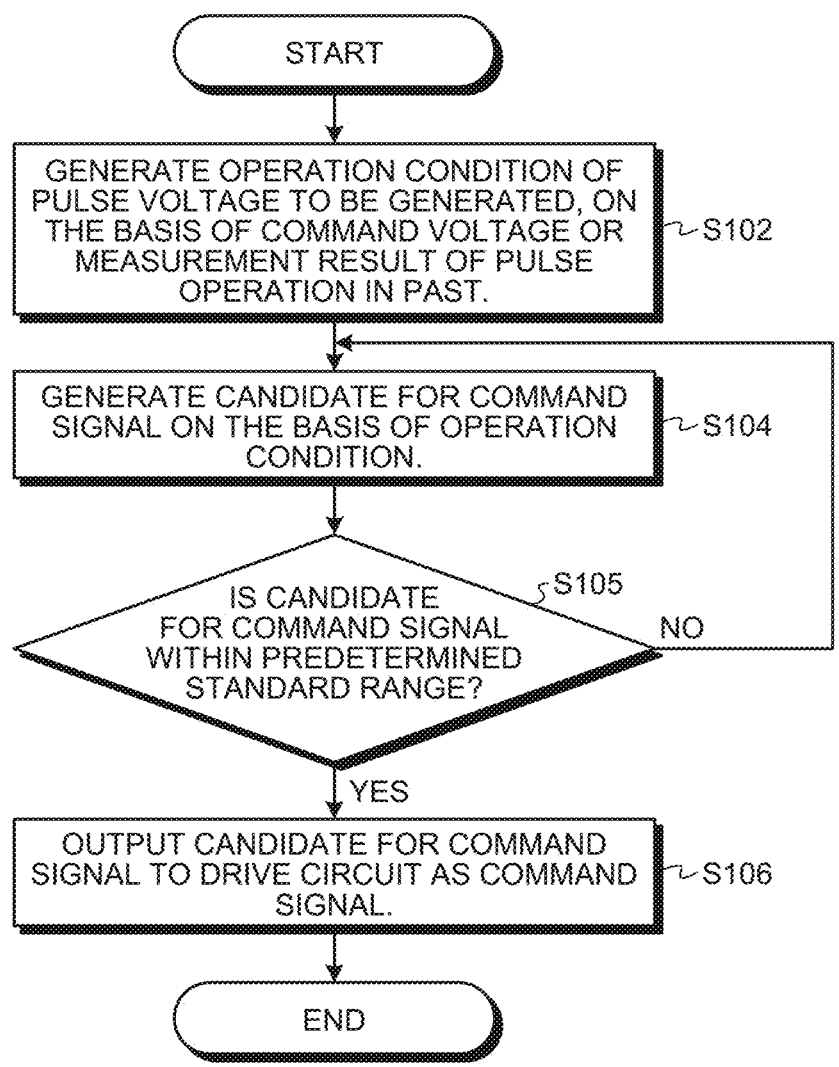
FIG. 12 is a flowchart describing an operation of the control unit according to the modification of the first embodiment.

The operation condition generation unit 11, the command signal candidate generation unit 15, the determination unit 16, and the command signal output unit 17 operate with each other. The cooperative operation of these will be described with reference to FIG. 12. FIG. 12 is a flowchart describing an operation of the control unit according to the modification of the first embodiment. Note that, in FIG. 12, identical or equivalent processes as those in FIG. 9 are denoted by identical reference numerals.

First, the operation condition generation unit 11 generates an operation condition of a pulse voltage to be generated, on the basis of a command voltage, a measurement result of a pulse operation in the past, or a combination thereof (step S102).

Next, the command signal candidate generation unit 15 generates a candidate for the command signal $Sig_{pq}$ on the basis of the operation condition generated in step S102 (step S104). Here, a number of generated candidates may be one or more. Note that the term "candidate" means that the generated candidates are not determined to be output as the command signal $Sig_{pq}$, and as for a generation method itself, the method of the control unit 1 can be used.

Next, the determination unit 16 determines whether or not the candidate for the command signal $Sig_{pq}$ generated by the command signal candidate generation unit 15 falls within a range of a predetermined standard, that is, satisfies a predetermined standard (step S105). When the candidate for the command signal $Sig_{pq}$ satisfies the predetermined standard (Step S105, Yes), the process proceeds to step S106. Whereas, when the candidate for the command signal $Sig_{pq}$ does not satisfy the predetermined standard (Step S105, No), the process proceeds to step S104, and the processes of steps S104 and S105 are repeated until a candidate for the command signal $Sig_{pq}$ is found.

Next, the command signal output unit 17 outputs, as the command signal $Sig_{pq}$ the candidate for the command signal $Sig_{pq}$ that is within the standard range, to the drive circuit 7 (step S106).

Note that the determination processing in step S105 may be performed using any standard. As an example, the determination processing can be performed on the basis of a measurement result of a pulse operation in the past, an energy saving condition, a use frequency of the pulse power supplies P1 to Pn, and the like, as a matter of course that the operation condition generated in step S102 is satisfied.

Next, a hardware configuration of the control units 1 and 1a for implementing the functions of the control units 1 and 1a described above will be described. In the control units 1 and 1a described above, the functions of the operation condition generation unit 11, the command signal generation unit 12, and the command signal data set generation unit 14, and the command signal candidate generation unit 15, the determination unit 16, and the command signal output unit 17 can be implemented by using a processor or processing circuitry. In addition, the command signal data set 13 can be implemented using a storage device. Note that the functions of the control units 1 and 1a may be implemented using both the processor and the processing circuitry.

In addition, some or all of the components in the control units 1 and 1a may be provided external to the pulse power supply device 100. For example, the control units 1 and 1a may be a computer including a processor and a storage device and connected to a power supply device via a network.

Then, the functions described above can be implemented by operating software, firmware, or a combination thereof by the processor or the processing circuitry. The software or the firmware may be described as a program, stored in the storage device, and read and executed by the processor or the processing circuitry. It can also be said that these programs cause a computer to execute the operations described above, that is, execution procedures and methods.

Examples of the semiconductor memory used as the storage device include a random access memory (RAM), a read only memory (ROM), and a flash memory. Further, an erasable programmable read only memory (EPROM), an electrically erasable programmable read only memory (EEPROM) (registered trademark), and the like can be exemplified.

The semiconductor memory may be a nonvolatile memory or a volatile memory. Further, a magnetic disk, a flexible disk, an optical disk, a compact disk, a mini disk, or a digital versatile disc (DVD) may be used as the storage device, other than the semiconductor memory.

The command signal data set 13 generated in step S101 of FIG. 9 is stored in the storage device as a lookup table. In this case, in step S103, the command signal $Sig_{pq}$ corresponding to an operation condition range can be outputted by referring to the lookup table.

Further, the functions of the control units 1 and 1a may be implemented by one piece of dedicated processing circuitry. In addition, one piece of dedicated processing circuitry may be provided for each of the processes of FIGS. 9 and 12 in the control units 1 and 1a, and each piece of dedicated processing circuitry may be caused to perform each corresponding process.

Examples of the dedicated processing circuitry include a single circuit, a composite circuit, a programmed processor, a parallel-programmed processor, an application specific integrated circuit (ASIC), and a field programmable gate array (FPGA). In addition, a combination thereof can be exemplified.

As described above, the pulse power supply device according to the first embodiment includes a plurality of pulse power supplies each of which outputs a monopolar pulse voltage, and a plurality of transformers. Each of the plurality of transformers includes the primary winding, the secondary winding, and the tertiary winding. Both ends of a plurality of the secondary windings connected in series constitute the output terminals, and the load is connected to the output terminals. Both ends of a plurality of the tertiary windings connected in series constitute the voltage application terminals, and the magnetic reset circuit is connected to the voltage application terminal. The magnetic reset circuit includes a magnetic reset power supply that is a power supply for causing a reset current to flow through the tertiary windings, and includes an impedance changing circuit. The impedance changing circuit is configured to be able to chance an inductance value for limiting an induced current that can be caused to flow in the second closed circuit by a voltage induced in the tertiary windings. With this configuration, it is possible to prevent an output impedance of the pulse power supply device from becoming larger than necessary, while appropriately performing magnetic reset of the magnetic body core in the plurality of transformers. This makes it possible to reduce or prevent an influence of the output impedance of the pulse power supply device, to obtain an output voltage having a desired pulse width.

Second Embodiment

Figure 13:
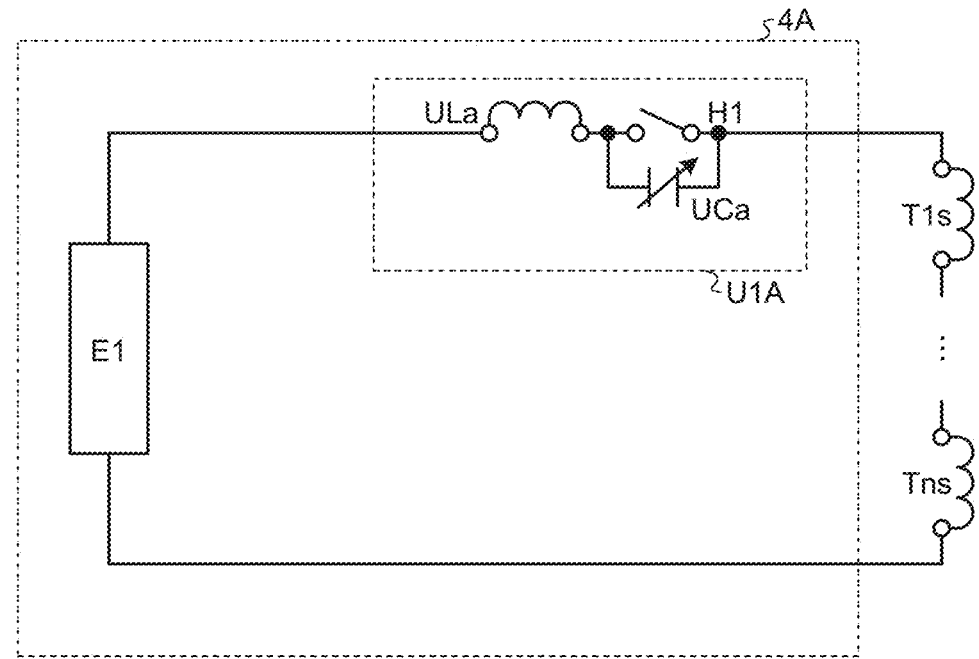
FIG. 13 is a diagram illustrating an exemplar configuration of a magnetic reset circuit according to a second embodiment.

In the first embodiment, the impedance changing circuit U1 of the magnetic reset circuit 4 is configured to change an inductance value, but may be configured to change a capacitance value. FIG. 13 is a diagram illustrating an exemplar configuration of a magnetic reset circuit according to a second embodiment.

In a magnetic reset circuit 4A illustrated in FIG. 13, the impedance changing circuit U1 is replaced with an impedance changing circuit U1A as compared with the magnetic reset circuit 4 illustrated in FIG. 6. Other configurations are identical as or equivalent to those in FIG. 6, and identical or equivalent components are denoted by identical reference numerals, and redundant descriptions are omitted.

As illustrated in FIG. 13, the impedance changing circuit U1A is inserted in series between the magnetic reset power supply E1 and the tertiary windings T1s to Tns. The impedance changing circuit U1A includes a restraint coil ULa, the switching element H1 connected in series to the restraint coil ULa, and a capacitor UCa that is a variable capacitor connected in parallel to the switching element H1.

In the impedance changing circuit U1A, an inductance value of the restraint coil ULa is set to a value at which an excessive current caused by induced voltages of the tertiary windings T1s to Tns does not flow to the magnetic reset power supply E1. At a time of performing magnetic reset, the switching element H1 is controlled to be turned on, both ends of the capacitor UCa are short-circuited, and a reset current is caused to flow in the tertiary windings T1s to Tns by the magnetic reset power supply E1.

At a time of reducing or preventing an overcurrent, the impedance changing circuit U1A can be regarded as an LC series circuit of the restraint coil ULa and the capacitor UCa, and the output impedance of the power supply unit 2 is determined by a combined impedance determined by an inductance value of the restraint coil ULa and a capacitance value of the capacitor UCa. By changing the capacitance value of the capacitor UCa in accordance with the output of the pulse power supply device 100, the output impedance can be appropriately set. As a result, it is possible to obtain an output voltage having a desired pulse width, while appropriately performing magnetic reset of the magnetic body cores 3e. In addition, an output voltage having a shorter pulse width than that of a conventional pulse power supply device can be easily obtained. In addition, even if specifications of the transformers Tr1 to Trn, magnitude of the output voltage, or the like is changed, it is possible to flexibly cope with these.

Note that, in FIG. 13, the capacitor UCa is configured by a variable capacitor, but is not limited thereto. A plurality of capacitors may be prepared, and some or all of these may be combined to change the capacitance value.

As described above, the magnetic reset circuit included in the pulse power supply device according to the second embodiment is configured to be able to change a capacitance value. With this configuration, similarly to the first embodiment, it is possible to prevent an output impedance of the pulse power supply device from becoming larger than necessary, while appropriately performing magnetic reset of the magnetic body core in the plurality of transformers. This makes it possible to reduce or prevent an influence of the output impedance of the pulse power supply device, to obtain an output voltage having a desired pulse width.

Third Embodiment

Figure 14:
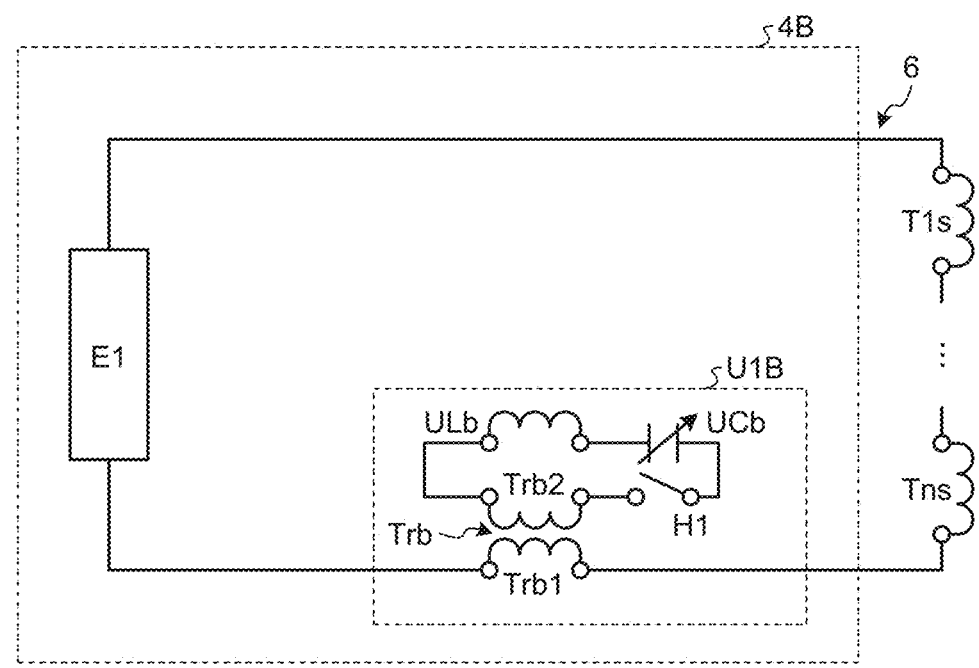
FIG. 14 is a diagram illustrating an exemplar configuration of a magnetic reset circuit according to a third embodiment.

In the first embodiment, the impedance changing circuit U1 of the magnetic reset circuit 4 is configured to change an inductance value, but may be configured to change an impedance via a transformer. FIG. 14 is a diagram illustrating an exemplar configuration of a magnetic reset circuit according to a third embodiment.

In a magnetic reset circuit 4B illustrated in FIG. 14, the impedance changing circuit U1 replaced with an impedance changing circuit U1B as compared with the magnetic reset circuit 4 illustrated in FIG. 6. Other configurations are identical as or equivalent to those in FIG. 6, and identical or equivalent components are denoted by identical reference numerals, and redundant descriptions are omitted.

As illustrated in FIG. 14, the impedance changing circuit U1B is inserted in series between the magnetic reset power supply E1 and the tertiary windings T1s to Tns. The impedance changing circuit U1B includes a restraint coil ULb, the switching element H1, a capacitor UCb that is a variable capacitor, and an impedance conversion transformer Trb. The switching element H1 is connected in series to the restraint coil ULb. The capacitor UCb is connected in series to the restraint coil ULb and the switching element H1. The impedance conversion transformer Trb includes a primary winding Trb1 and a secondary winding Trb2. The primary winding Trb1 is inserted into the second closed circuit 6. The secondary winding Trb2 is connected in series to the restraint coil ULb, the switching element H1, and the capacitor UCb to form a closed circuit.

The impedance changing circuit U1B according to the third embodiment can change, that is, step up or step down a voltage across the impedance changing circuit U1B by a transformer ratio, which is a ratio between a number of turns of the primary winding Trb1 and a number of turns of the secondary winding Trb2. Since a reactor and a capacitor are not required for stepping up and down of the voltage, it is possible to increase a withstand voltage without increasing a size. Similarly to the second embodiment, an output impedance can be appropriately set by changing a capacitance value of the capacitor UCb for each voltage pulse. As a result, it is possible to obtain an output voltage having a desired pulse width, while appropriately performing magnetic reset of the magnetic body cores 3e. In addition, an output voltage having a shorter pulse width than that of a conventional pulse power supply device can be easily obtained. In addition, even if specifications of the transformers Tr1 to Trn, magnitude of the output voltage, or the like is changed, it is possible to flexibly cope with these.

Note that, in FIG. 14, the capacitor UCb is configured by a variable capacitor, but is not limited thereto. A plurality of capacitors may be prepared, and some or all of these may be combined to change the capacitance value. Further, instead of or in addition to this configuration, a plurality of restraint coils may be prepared, and an inductance value may be changed by combining some or all of these.

As described above, the magnetic reset circuit included in the pulse power supply device according to the third embodiment includes the impedance conversion transformer, and is configured to be able to change an impedance. With this configuration, similarly to the first embodiment, it is possible to prevent an output impedance of the pulse power supply device from becoming larger than necessary, while appropriately performing magnetic reset of the magnetic body core in the plurality of transformers. This makes it possible to reduce or prevent an influence of the output impedance of the pulse power supply device, to obtain an output voltage having a desired pulse width.

The configuration illustrated in the above embodiments illustrates one example and can be combined with another known technique, and it is also possible to combine embodiments with each other and omit and change a part of the configuration without departing from the gist.

REFERENCE SIGNS LIST 1, 1a control unit; 2 power supply unit; 3 transformer group; 3a, 3b output terminal; 3c, 3d voltage application terminal; 3e magnetic body core; 4, 4A, 4B magnetic reset circuit; 5 first closed circuit; 6 second closed circuit; 7 drive circuit; 8 load; 11 operation condition generation unit; 12 command signal generation unit; 13 command signal data set; 14 command signal data set generation unit; 15 command signal candidate generation unit; 16 determination unit; 17 command signal output unit; 100 pulse power supply device; C11 to C1j, UCa, UCb capacitor; DC1 DC power supply; E1 magnetic reset power supply; H1 to Hk, S11 to S1j switching element; L1, L2 inductance value; La1 to Lan, Trb1 primary winding; P1 to Pn pulse power supply; T1 to Tn, Trb2 secondary winding; T1s to Tns tertiary winding; Tr1 to Trn transformer; Trb impedance conversion transformer; U1, U1A, U1B impedance changing circuit; UL1 to ULk, ULa, ULb restraint coil.

The invention claimed is:

1. A pulse power supply device comprising:
a plurality of pulse power supplies each of which to output a pulse voltage that is monopolar; and
a plurality of transformers each comprising a primary winding, a secondary winding, and a tertiary winding, wherein one of the pulse power supplies is connected to one of the primary windings on a one-to-one basis, wherein
a plurality of the secondary windings are sequentially connected in series, both ends of a plurality of the secondary windings connected in series constitute output terminals, and a load is connected to the output terminals to form a first closed circuit,
a plurality of the tertiary windings are sequentially connected in series, both ends of a plurality of the tertiary windings connected in series constitute voltage application terminals, a magnetic reset circuit is connected to the voltage application terminals, and a plurality of the tertiary windings and the magnetic reset circuit form a second closed circuit, and
the magnetic reset circuit comprises:
a magnetic reset power supply that is a power supply to cause a reset current to flow through the tertiary windings; and
an impedance changing circuit configured to be able to change an impedance for limiting an induced current that is possible to be caused to flow in the second closed circuit by a voltage induced in the tertiary windings.

2. The pulse power supply device according to claim 1, wherein
each of the pulse power supplies comprises:
a plurality of switching elements;
a plurality of capacitors each connected in series to each of the switching elements and connected in parallel to one another; and
a direct current power supply to apply a DC voltage to both ends of each of the capacitors, and
a plurality of series circuits in which one of the switching elements and one of the capacitors are connected in series are included, a plurality of the series circuits are connected in parallel to one another to form a series-parallel circuit, and the pulse voltage is outputted from both ends of the series-parallel circuit.

3. The pulse power supply device according to claim 1, wherein
the impedance changing circuit comprises:
a plurality of restraint coils connected in parallel to one another; and
a plurality of switching elements each of which is connected in series to corresponding one of the restraint coils, and
at least one of the plurality of the restraint coils is selected and inserted into the second closed circuit.

4. The pulse power supply device according to claim 1, wherein
the impedance changing circuit comprises:
a restraint coil;
a switching element connected in series to the restraint coil; and
a variable capacitor connected in parallel to the switching element.

5. The pulse power supply device according to claim 1, wherein
the impedance changing circuit comprises:
a restraint coil;
a switching element connected in series to the restraint coil;
a variable capacitor connected in series to the restraint coil and the switching element; and
an impedance conversion transformer comprising a primary winding and a secondary winding,
the primary winding is inserted into the second closed circuit, and
the secondary winding is connected in series to the restraint coil, the switching element, and the variable capacitor to form a closed circuit.

6. The pulse power supply device according to claim 2, wherein
the impedance changing circuit comprises:
a plurality of restraint coils connected in parallel to one another; and
a plurality of switching elements each of which is connected in series to corresponding one of the restraint coils, and
at least one of the plurality of the restraint coils is selected and inserted into the second closed circuit.

7. The pulse power supply device according to claim 2, wherein
the impedance changing circuit comprises:
a restraint coil;
a switching element connected in series to the restraint coil; and
a variable capacitor connected in parallel to the switching element.

8. The pulse power supply device according to claim 2, wherein
the impedance changing circuit comprises:
a restraint coil;
a switching element connected in series to the restraint coil;
a variable capacitor connected in series to the restraint coil and the switching element; and
an impedance conversion transformer comprising a primary winding and a secondary winding,
the primary winding is inserted into the second closed circuit, and
the secondary winding is connected in series to the restraint coil, the switching element, and the variable capacitor to form a closed circuit.

* * * * *